March 20, 1962 K. D. F. CHISHOLM 3,026,427

ELECTRICAL PULSE DELAY AND REGENERATOR CIRCUITS

Filed July 13, 1959

Inventor:
Kenneth Duncan Fraser Chisholm
By: Stevens, Davis, Miller & Mosher, attorneys 3,026,427

ELECTRICAL PULSE DELAY AND REGENERATOR CIRCUITS

Kenneth Duncan Fraser Chisholm, Kidsgrove, England, assignor to The English Electric Company Limited, London, England, a British company Filed July 13, 1959, Ser. No. 826,560
Claims priority, application Great Britain July 23, 1958
4 Claims. (Cl. 307—88.5)

Figure 1:
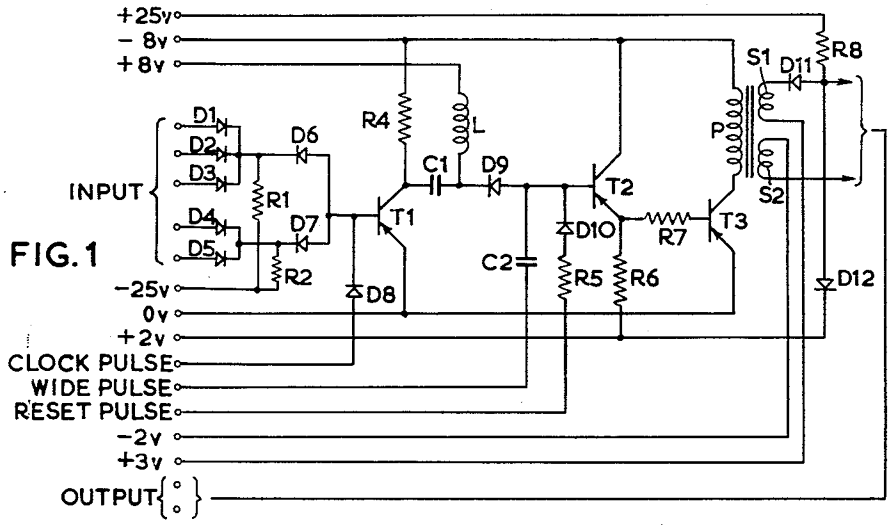

This invention relates to electrical pulse delay and regeneration circuits.

It is the object of the invention to provide a new and improved pulse delay and regeneration circuit particularly suited for use in circuit units performing logical functions. Such units find application in digital computers.

According to the invention, an electrical pulse delay and regeneration circuit responsive to individual input pulses which are substantially contiguous in time with pulses in a regularly recurrent pulse signal comprises an output circuit having a high input impedance and a cut-off level sensitive to the magnitude of a signal comprising a component supplied by said regularly recurrent pulse signal through a capacity coupling, a component supplied by a regular periodic resetting signal which fixes the level of the signal supplied to said high input impedance output circuit between pulse periods of the recurrent pulse signal, and a further component arising from the generation of a delayed pulse for each said individual input pulse which further fixes the level of the signal supplied to said high impedance output circuit between pulse periods of the recurrent pulse signal but following the action of the resetting signal, the level fixed by the action of the resetting signal being below the cut-off level of the output circuit by an amount exceeding the step transmitted through the capacitor by a pulse in the recurrent signal and the level fixed by the action of the delayed pulse being below the cut-off level of the output circuit by an amount not exceeding said step.

According to a feature of the invention, said regular periodic resetting signal comprises a series of short-duration pulses occurring immediately following the pulses in said regularly recurrent pulse signal.

According to a further feature of the invention, a pulse coincidence detecting circuit operates to promote an oscillation in an inductor-capacitor ringing circuit when an input pulse is present at the end of a pulse in said regularly recurrent pulse signal, this oscillation being transmitted through a uni-directional conductive device to provide said delayed pulse and tuned so that the oscillation is initiated in a polarity sense which biases the uni-directional conductive device against conduction and reverses to have the opposite polarity sense and to be communicated through the uni-directional conductive device to the output circuit subsequent to the termination of the next pulse in the resetting signal.

According to a still further feature of the invention, said pulse coincidence detecting circuit operates to detect pulse coincidence between said input pulses and short duration clock pulses occurring during the later portion of each pulse in said regularly recurrent pulse signal.

It is to be noted that the high input impedance output circuit having a cut-off level sensitive to the magnitude of a supplied signal may for example be a cathode-follower output stage or its transistor equivalent, the emitter-follower.

Other features of the invention relate to the application of the pulse delay and regeneration circuit in a logical "brick" forming a standard logical circuit unit which may be used with advantage in digital computers.

Thus it is in accordance with another feature of the invention for a logical circuit unit to comprise in combination a logical gating network, a pulse delay and regeneration circuit operative in response to output pulses supplied by this network, and an amplifier having a two-secondary matched transformer load which responds to the output from the pulse delay and regeneration circuit and is operative to provide true and complementary output signals of sufficient power to control the operation of a number of similar logical circuit units, the pulse delay and regeneration circuit having a form already described and the logical circuit unit being adapted for operation in conjunction with a number of others in common response to a single regularly recurrent signal containing relatively wide pulses, a single pulse signal of short duration clock pulses, and a single pulse signal of short duration resetting pulses.

This invention provides by one of its features a logical circuit unit which is particularly suited to use as a standard unit from which to assemble digital computers.

A standardization of an elemental electrical network which can be used in several stages of a computer circuit of necessity includes parts in its logical circuit which are not likely to be used in each and every stage. Such standardization is therefore only feasible economically if the elemental network has a high performance combined with economy in circuit components and assembly.

In its preferred form the circuit unit comprises an AND/OR gate and performs the following desirable functions:

(1) It operates in response to one phase of clock pulses.

(2) The input pulses can suffer time degeneration.

(3) The versatility of the AND/OR gate is not weakened by the use of the gate functions by feedback signals.

(4) An amplification system is included by which one such unit can drive a number of others and this amplification system is matched to the load.

(5) The unit produces in a simple manner an inverted version of its normal output signal.

Figure 2:
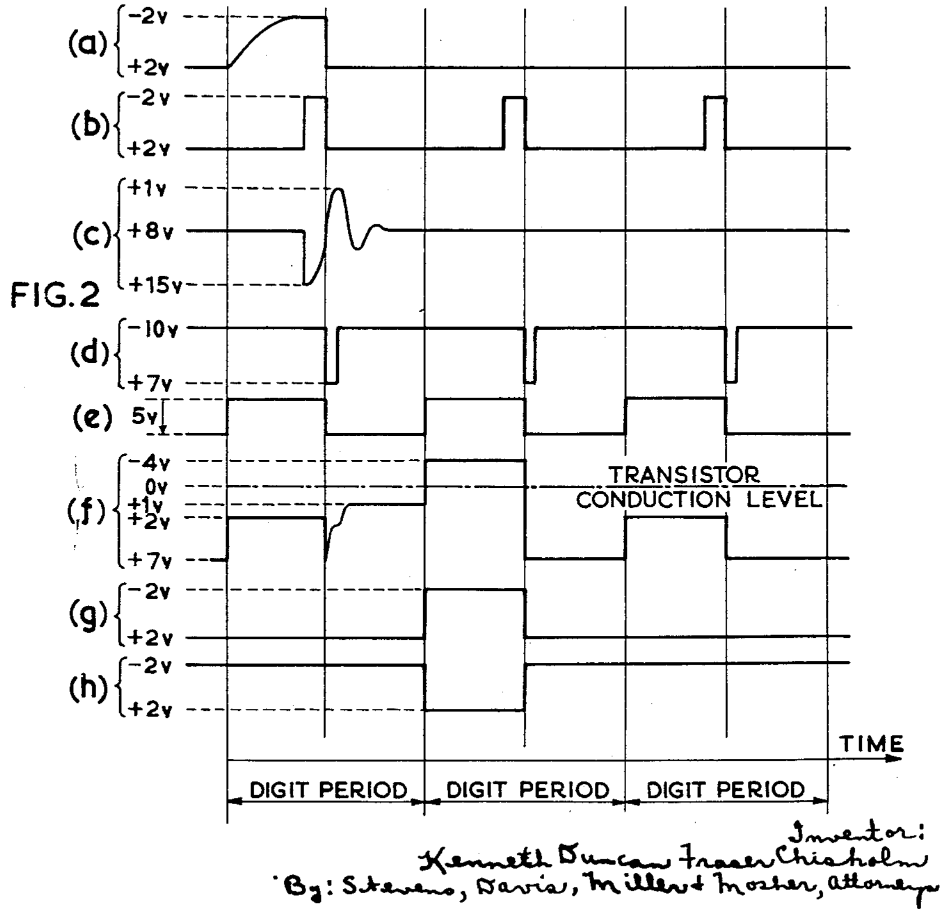

A network embodying the invention in the performance of these functions will now be described with reference to the accompanying drawing in which:

FIG. 1 shows the circuit of a unit which performs a logical function and incorporates a pulse delay and regeneration circuit embodying the invention in one preferred form, and FIG. 2 shows voltage wave-forms applicable to the operation of the pulse delay and regeneration circuit shown in FIG. 1.

The function of the circuit shown in FIG. 1 can be more clearly understood by first considering the wave-forms of FIG. 2. Here, the voltage convention is opposite to that normally used in such wave-forms in order to facilitate the appreciation of the operation of the p-n-p type transistors incorporated in the circuit of FIG. 1.

The circuit is intended to respond to a sequence of input pulses which may have a duration less than each consecutive digit period. The circuit is required to respond to each such input pulse and to regenerate the pulse and improve its shape one digit period later, preferably supplying two output pulse signals, one being the voltage inversion of the other.

Thus, the wave-forms of FIG. 2 indicate what happens to an input pulse shown in wave-form (*a*), the outputs from the circuit being required to have the forms shown in wave-forms (*g*) and (*h*) respectively. It will be seen that the leading edge of the input pulse builds up slowly whereas the output pulses are required to be more clearly defined. This caters for time-lag effects which may be encountered in the circuit supplying the input pulses (for example, in the gating network to be described with reference to FIG. 1). These effects can distort the input pulse in the manner indicated in wave-form (*a*) and it is this distortion which makes a regeneration of the pulse after a time delay desirable in logical circuits such as are found in digital computers.

The input to the circuit of FIG. 1 is supplied to a gating network comprising a number of diodes connected to act as an AND/OR gate. In the absence of input pulses of the kind represented by wave-form (*a*) positive 2 volt signals are applied to the anodes of each of the diodes D1, D2, D3, D4 and D5. These diodes are arranged in two groups, diodes D1, D2 and D3 having a common connection between their cathodes and diodes D4 and D5 having a similar common connection. These connections are respectively through resistors R1 and R2 to a negative 25 volt supply and also respectively to the cathodes of diodes D6 and D7 which have a common anode connection to the base of a p-n-p type transistor T1. The base of this transistor is connected through a diode D8 to a control pulse supply. This latter supply comprises a series of clock pulses having the form depicted by wave-form (*b*) and the diode D8 has its cathode connected to the base of T1.

In the absence of a clock pulse the diode D8 is conductive and holds the transistor base at a positive potential, preventing transistor conduction. In the presence of a clock pulse diode D8 is biased against conduction and therefore the transistor is free to conduct provided either diode D6 or diode D7 is not biased against conduction to the negative 25 volt source by the absence of input signals.

With no input pulses supplied to the gating network the cathodes of diodes D6 and D7 are held at 2 volts positive. These diodes conduct but the base of transistor T1 is held at 2 volts positive so there is no conduction in the transistor output circuit even when a clock pulse is present.

When negative input pulses are applied simultaneously to the anodes of diodes D1, D2 and D3 the cathode of diode D6 is held at a negative potential. This allows transistor T1 to conduct regardless of the bias on diode D7 but subject to the presence of a clock pulse. Similarly when negative input pulses are applied simultaneously to the anodes of diodes D4 and D5 the cathode of diode D7 is held at a negative potential and the transistor can conduct in response to clock pulses.

In computer terminology the diode network operates as an AND/OR gate performing a logical circuit function.

In a computer application the input pulses and clock pulses have a time co-ordination but it suffices for the following description to accept that the clock pulses are of shorter duration than the input pulses and that the presence of an appropriate AND/OR combination of input pulses is indicated by a conductive condition of transistor T1 for a period corresponding to the presence of a clock pulse. It is also to be noted that the levels of all pulses are standardized.

The emitter of transistor T1 is connected to a zero reference potential and the collector is connected through a resistor R4 to a negative 8 volt supply. The collector is also connected to a capacitor C1 which forms a ringing circuit with an inductor L connected to a positive 8 volt supply as shown.

Thus, normally, as depicted in wave-form (*c*), the common connection of C1 and L is at 8 volts positive. A pulsed conduction of the collector-emitter circuit of T1 drives this connection more positive (to about 15 volts with a typical transistor). This transient condition initiates an oscillation and C1 and L are matched with regard to the clock pulse width so that the trailing edge of the pulsed conductive condition of the transistor drives the common connection of C1 and L negative in harmony with the oscillation in this sense. Thus, in spite of a fairly heavy damping incorporated in the design of the inductor capacitor circuit to prevent prolonged oscillation, the presence of a pulsed conductive condition of transistor T1 yields a pulse signal at the connection of C1 and L which falls to an inverted peak of about 1 volt positive as shown by wave-form (*c*).

The signal indicated by wave-form (*c*) is applied through a diode D9 to the base of transistor T2. Also a reset signal indicated by wave-form (*d*) is applied through a resistor R5 and a diode D10 to the base of T2. Transistor T2 operates as an emitter-follower, having its collector connected directly to a negative 8 volt supply and its emitter connected to a negative 2 volt supply through a resistor R6. Further, a capacitor C2 is connected between the base of transistor T2 and a pulse supply source having a wave-form shown by (*e*) in FIG. 2. Diodes D9 and D10 are connected as shown in FIG. 1.

In operation, the function of a reset pulse is to drive the base of transistor T2 to a reference level of 7 volts positive which is maintained by the action of capacitor C2 until some other pulse action disturbs the system. This reset pulse occurs early during a period of the more positive parts of the wave-form depicted as (*e*) in FIG. 2. Thus, the base potential of T2 will be disturbed when this wide pulse supply goes 5 volts negative. This will decrease the base potential of T2 to 2 volts positive until reset occurs.

Under these conditions transistor T2 remains non-conductive. The standard 8 volt positive level of wave-form (*c*) ensures that D9 remains non-conductive. However, when the ringing pulse occurs in wave-form (*c*) D9 can conduct and prevents the base potential of T2 from rising to 7 volts positive in response to the reset signal. Instead the base voltage is held at 1 volt positive so that when the next 5 volt change in the pulse supplied through capacitor C2 occurs the base potential of T2 falls to 4 volts negative and effectively remains at this level until the next reset pulse occurs. The discharge of capacitor C2 will result in an exponential decay of the signal but the design of the circuit ensures operation as described. This corresponds to a conductive condition of T2 for a period governed by the wide pulse width of the signal supplied through capacitor C2, wave-form (*f*) indicating the time-sequence of this event.

It will be seen that the wide pulses can be gated through an emitter-follower in response to the AND/OR input detection so as effectively to regenerate and reshape the input pulse controlling system operation.

The output from the emitter-follower stage afforded by transistor T2 controls a transistor amplifier supplying a transformer having two secondary windings. This transformer forms a load which is matched to the amplifier and by virtue of its double secondary winding is able to afford two output signals one of which is an inverted voltage version of the other.

In FIG. 1 this output circuit comprises a transistor T3 which receives its input signal from T2 via a resistor R7 and a transformer having a primary winding P connected in the collector circuit of T3, its secondary windings S1 and S2 providing true and complementary output signals respectively. The output circuit also includes an arrangement of diodes D11 and D12 and resistor R8 connected to facilitate the supply of pulses by winding S1. The circuit is designed so that the amplitudes of the voltage pulse induced in S1 and S2 are equal to 5 volts and 4 volts respectively. Thus S2 is able to supply a signal having the wave-form (*h*) shown in FIG. 2. On the other hand S1 has a more complex output circuit to facilitate the use of the circuit shown in FIG. 1 for branching, that is for use in conjunction with a number of other similar circuits which will derive their inputs from the winding S1.

With the output circuit shown a current flows from the positive 25 volt supply through resistor R8 and diode D12 to the positive 2 volt supply. Any AND gates of other similar circuits connected to the output from S1 can demand up to this current from the circuit without reducing the output potential appreciably.

Thus normally there is an output of 2 volts from the circuit including S1. When the pulse appears the cathode of diode D11, which is otherwise at 3 volts positive, is driven 5 volts in the negative direction. This causes D12 to become non-conductive and the output from the circuit is then 2 volts negative as indicated by wave-form (*g*) in FIG. 2.

What I claim as my invention and desire to secure by Letters Patent is:

1. An electrical pulse delay and regeneration circuit comprising an amplifier of the kind having an input cut-off level, means to apply to the input of said amplifier a regular periodic resetting signal so as to set a first input level below said cut-off level, means responsive to a delayed pulse derived from each input pulse required to be regenerated to change the input level of said amplifier from said first level to a second level higher than said first level, and means thereafter to apply through a capacitor to the input of said amplifier a regularly recurrent rectangular pulse signal having an amplitude less than the difference between said first level and said cut-off level but greater than the difference between said second level and said cut-off level and having a duration equal to that of the required regenerated pulse.

2. An electrical pulse delay and regeneration circuit according to claim 1, wherein said regular periodic resetting signal comprises a series of short-duration pulses occurring immediately following the pulses in said regularly recurrent pulse signal.

3. An electrical pulse delay and regeneration circuit according to claim 2, which further comprises a pulse coincidence detecting circuit operative to promote an oscillation in an inductor-capacitor ringing circuit when an input pulse is present at the end of a pulse in said regularly recurrent pulse signal, this oscillation being transmitted through a uni-directional conductive device to provide said delayed pulse and tuned so that the oscillation is initiated in a polarity sense which biases the uni-directional conductive device against conduction and reverses to have the opposite polarity sense and to be communicated through the uni-directional conductive device to the amplifier subsequent to the termination of the next pulse in the resetting signal.

4. An electrical pulse delay and regeneration circuit according to claim 3, wherein said pulse coincidence detecting circuit operates to detect pulse coincidence between said input pulses and short duration clock pulses occurring during the later portion of each pulse in said regularly recurrent pulse signal.

References Cited in the file of this patent

UNITED STATES PATENTS

| | | |
|---|---|---|
| 2,577,355 | Oliver | Dec. 4, 1951 |
| 2,672,554 | Roussel | Mar. 16, 1954 |
| 2,748,270 | Eckert et al. | May 29, 1956 |
| 2,842,682 | Clapper | July 8, 1958 |
| 2,873,384 | Schoen et al. | Feb. 10, 1959 |